US00RE37546E

(19) United States
(12) Reissued Patent
Mahawili

(10) Patent Number: US RE37,546 E
(45) Date of Reissued Patent: Feb. 12, 2002

(54) REACTOR AND METHOD OF PROCESSING A SEMICONDUCTOR SUBSTRATE

(75) Inventor: Imad Mahawili, Grand Rapids, MI (US)

(73) Assignee: Micro C Technologies, Inc., Kentwood, MI (US)

(21) Appl. No.: 09/672,842

(22) Filed: Sep. 28, 2000

Related U.S. Patent Documents

Reissue of:
(64) Patent No.: 5,814,365
Issued: Sep. 29, 1998
Appl. No.: 08/911,638
Filed: Aug. 15, 1997

(51) Int. Cl.[7] ..... C23C 16/00
(52) U.S. Cl. ..... 427/10; 427/248.1; 118/666; 118/708; 118/712; 118/715; 118/725; 118/730; 374/131; 374/141
(58) Field of Search ..... 427/10, 248.1; 118/666, 708, 712, 715, 725, 730; 374/131; 324/141

(56) References Cited

U.S. PATENT DOCUMENTS 4,550,684 A 11/1985 Mahawili
4,680,447 A 7/1987 Mahawili
4,993,358 A 2/1991 Mahawili
5,155,336 A 10/1992 Gronet et al.
5,156,461 A 10/1992 Moslehi et al. ..... 374/121
5,310,260 A 5/1994 Schietinger et al.
5,317,492 A 5/1994 Gronet et al.
5,366,002 A 11/1994 Tepman
5,453,124 A 9/1995 Moslehi et al.
5,487,127 A 1/1996 Gronet et al.
5,490,728 A 2/1996 Schietinger et al.
5,531,835 A 7/1996 Fodor et al.
5,566,744 A 10/1996 Tepman

*Primary Examiner*—Richard Bueker
(74) *Attorney, Agent, or Firm*—Van Dyke, Gardner, Linn & Burkhart, LLP

(57) ABSTRACT

A reactor for processing a substrate includes a first housing defining a processing chamber and supporting a light source and a second housing rotatably supported in the first housing and adapted to rotatably support the substrate in the processing chamber. A heater for heating the substrate is supported by the first housing and is enclosed in the second housing. The reactor further includes at least one gas injector for injecting at least one gas into the processing chamber onto a discrete area of the substrate and a photon density sensor extending into the first housing for measuring the temperature of the substrate. The photon density sensor is adapted to move between a first position wherein the photon density sensor is directed to the light source and a second position wherein the photon density sensor is positioned for directing toward the substrate. Preferably, the communication cables comprise optical communication cables, for example sapphire or quartz communication cables. A method of processing a semiconductor substrate includes supporting the substrate in a sealed processing chamber. The substrate is rotated and heated in the processing chamber in which at least one reactant gas is injected. A photon density sensor for measuring the temperature of the substrate is positioned in the processing chamber and is first directed to a light, which is provided in the chamber for measuring the incident photon density from the light and then repositioned to direct the photon density sensor to the substrate to measure the reflection of the light off the substrate. The incident photon density is compared to the reflected light to calculate the substrate temperature.

61 Claims, 3 Drawing Sheets

REACTOR AND METHOD OF PROCESSING A SEMICONDUCTOR SUBSTRATE

Matter enclosed in heavy brackets [ ] appears in the original patent but forms no part of this reissue specification; matter printed in italics indicates the additions made by reissue.

BACKGROUND AND TECHNICAL FIELD OF THE INVENTION

The present invention relates to a processing reactor and, more particularly to a processing reactor for the thermal processing and chemical deposition of thin film applications on a substrate, such as semiconductor wafer, in which the temperature of the substrate can be accurately monitored and the injection of gas into the chamber can be controlled to provide better control of the substrate processing.

In semiconductor fabrication, semiconductor substrates are heated during various temperature activated processes for example, during film deposition, oxide growth, etching, and thermal annealing. The control of deposition and annealing processes depends on the control of the gas flow and pressure and the wafer temperature. When heating a substrate, it is desirable to heat the substrate in a uniform manner so that all the regions of the substrate are heated to the same temperature. Uniform temperatures in the substrate provide uniform process variables on the substrate; for instance in film deposition, if the temperature in one region of the substrate varies from another region, the thickness of the deposition in these regions may not be equal. Moreover, the adhesion of the deposition to the substrate may vary as well. Furthermore, if the temperature in one region of the substrate is higher or lower than the temperature in another region of the substrate, a temperature gradient within the substrate material is formed. This temperature gradient produces thermal moments in the substrates which in turn induce radial local thermal stresses in the substrate. These local thermal stresses can reduce the substrate's strength and, furthermore, damage the substrate. Therefore, knowing the temperature of the wafer is important in determining the thermal diffusion depths of surface implanted dopants, the deposited film thickness, and the material constitution quality and annealed or reflowed characteristics.

Various methods have been developed for measuring the temperature of a substrate during processing in order to improve the control of the various processes. Direct methods, which include the use of contact probes, such as thermocouples or resistance wire thermometers, are generally not suitable for substrate processing because direct contact between the probes and the substrate contaminates the device structure. More typically, indirect measuring methods are used, such as the use of preheated platforms that are calibrated prior to processing. However, this method is not typically accurate. In some applications, the temperature of the back side of the substrate is calibrated or monitored, but such methods also lead to significant errors due to the large variances between the back side and device side surface characteristics that lead to different substrate temperatures. The patterns of the specific devices being processed, the type of material being deposited or annealed, the degree of the roughness of the surface, and the operating temperature all affect the characteristics of the substrate surface and define what is known as the surface emissivity of the substrate.

In U.S. Pat. No. 5,310,260 to Schietinger et al. a non-contact temperature measuring device is disclosed. The device includes two sapphire optical fibre probes, with one of the probes directed to the lamp source providing the heat to the wafer and the other probe directed to the wafer itself. Each fiber probe sends its respective signal to a measuring instrument which converts the photon density measured by the probe to an electrical current. The ratio of the two signals provides a measure of the surface reflectivity, which approximates the total hemispherical reflectivity. However, this method can only be used with an AC source lamp and when the lamp shines directly on the wafer. Since two optical fiber probes must be used in order to implement this technique, the characteristics of each probe must be accurately detailed in order to obtain accurate emissivity measurements. In the event that one of the probes must be replaced, a total system re-calibration is required. Furthermore, this method cannot be used in chambers in which thin films are deposited, etched, or sputtered since the thin films will also deposit on the optical fiber photon density sensors and drastically alter the results and render the measurement method inoperative. Moreover, the optical fiber sensors are always directed at one fixed area of the wafer. Since different parts of the wafer may have different device patterns and, therefore, may have different local emissivities, the temperature measurement and control would be limited in value as it would represent the emissivity information only for that specific area rather than the average surface topology of the substrate.

In addition to temperature uniformity, the uniformity of film deposition is affected by uniformity of the delivery of the process gas. Good process uniformity usually requires adjustments and optimizations for both the wafer temperature uniformity and the gas flow pattern of the process gas. In most conventional chambers or reactors, the reactant gas is delivered through a single port, which injects gas into the chamber above the wafer. Due to the geometry of the wafer, the resulting deposition of the gas onto the wafer is not uniform.

More recently, shower-like gas injection systems have been developed in which separate gases are injected in a shower-like pattern over the entire substrate area. However, such gas delivery systems fill the entire chamber volume and, thus, deposit films on the substrate as well as the chamber walls. Consequently, these gas delivery systems preclude the use of any optical instruments for non-contact temperature measurement and in-situ film methodology.

Consequently, there is a need for a processing reactor which can deliver heat to a substrate in a uniform manner and can accurately monitor the temperature of the substrate during processing and adjust the profile of the applied heat as needed to achieve optimal processing of the substrate. Furthermore, there is a need for a processing reactor which can deliver and direct the flow of gas to the substrate during processing so that the substrate receives a uniform deposition of thin film of the process gas or gases in a discrete area on the substrate.

SUMMARY OF THE INVENTION

One form of the invention provides a reactor having a processing chamber with an emissivity measuring device and improved gas injection system. The emissivity measuring device measures the photon density from a light source, which is housed in the processing chamber, and the reflected photon density off a substrate, which is processed in the processing chamber. These measurements are then used to determine the emissivity and, ultimately, the temperature of the substrate with a high degree of accuracy. The emissivity measuring device includes a communications cable which includes a photon or emissivity sensor that is positioned in the processing chamber. The photon density sensor is adapted to move between a first position wherein the photon density sensor is directed to the light source for measuring the incident photon density of the light and a second position wherein the photon density sensor is directed toward the substrate for measuring the reflected photon density off the substrate. The gas injection system is adapted to inject and direct at least one gas onto a discrete area of the substrate. The reactor is, therefore, particularly suitable for use in a semiconductor fabrication environment where the control of heating and injection of gas must be maintained in order to produce uniform process variables during the fabrication of semiconductor devices.

In one aspect, the emissivity measuring device comprises first and second communication cables. The first communication cable includes the photon density sensor and is in communication with the second cable for sending signals from the photon density sensor to a processor. Preferably, the first and second communication cables comprise optical communication cables. For example, the first communication cable may comprise a sapphire optical communication cable, and the second communication cable may comprise a quartz optical communication cable. In further aspects, the first and second communications cables are interconnected by a slip connection so that the first communication cable can be rotated between the first and second positions by a driver, for example a motor.

In another form of the invention, a reactor for processing a substrate includes a first housing, which defines a processing chamber and supports a light source. A second housing is rotatably supported in the first housing and is adapted to rotatably support the substrate in the processing chamber. A heater for heating the substrate is supported by the first housing and is enclosed in the second housing. A photon density sensor extends into the first housing for measuring the emissivity of the substrate, which is adapted to move between a first position wherein the photon density sensor is directed to the light source and a second position wherein the photon density sensor is positioned for directing toward the substrate. The reactor further includes a plurality of gas injectors, the gas injectors being grouped into at least two groups of gas injectors, with each group of gas injectors being adapted to inject at least one gas into the processing chamber of the reactor onto a discrete area of the substrate.

In one aspect, each group of injectors is adapted to selectively deliver at least one reactant gas and an inert gas. In another aspect, each group of gas injectors is adapted to be independently controlled whereby flow of gas through each group of gas injectors can be independently adjusted. In yet another aspect, the gas injectors in each group of gas injectors may be arranged in a uniform pattern for directing a uniform flow of a gas toward the substrate. The reactor also preferably includes an exhaust manifold for removing unreacted gas from the processing chamber.

In yet further aspects, the gas injectors are arranged in pattern having a greater concentration of gas injectors in a peripheral region and a smaller concentration of gas injectors in a central region of the substrate whereby the gas injected by the gas injectors produces a uniform deposition on the substrate.

In yet another form of the invention, a method of processing a semiconductor substrate includes supporting the substrate in a sealed processing chamber. The substrate is rotated and heated in the processing chamber in which at least one reactant gas is injected. A photon density sensor for measuring the emissivity of the substrate is positioned in the processing chamber and is first directed to a light, which is provided in the chamber, for measuring the incident photon density from the light and then repositioned to direct the photon density sensor to the substrate to measure the reflected photon density off the substrate. The incident photon density is compared to the reflected photon density to calculate the substrate temperature.

As will be understood, the reactor of the present invention provides numerous advantages over prior known reactors. The reactor provides a single substrate photon density sensor which can be used to accurately determine the temperature of the substrate during processing. The single photon density sensor eliminates the need for recalibration and complex calculations detailing the characteristics of each sensor associated with temperature measuring devices having two sensors. Moreover, the reactor provides a gas injection system which directs one or more reactant gases to the substrate during processing in a controlled manner and directs the gas or gases to discrete regions of the substrate so that emissivity measurements and temperature calculations can be performed in the processing chamber during the injection of the gas or gases without impairment from undesirable film depositions on the emissivity measurement devices.

These and other objects, advantages, purposes and features of the invention will be apparent to one skilled in the art from a study of the following description taken in conjunction with the drawings.

DESCRIPTION OF THE PREFERRED EMBODIMENTS

Figure 1:
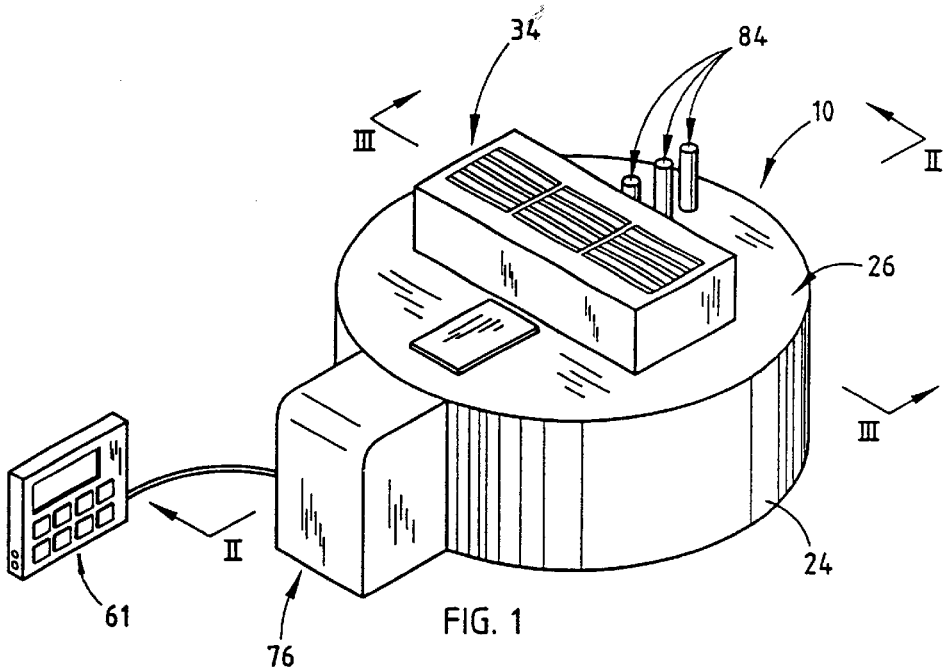
FIG. 1 is a perspective view of a chemical vapor deposition chamber of the present invention.
Figure 6:
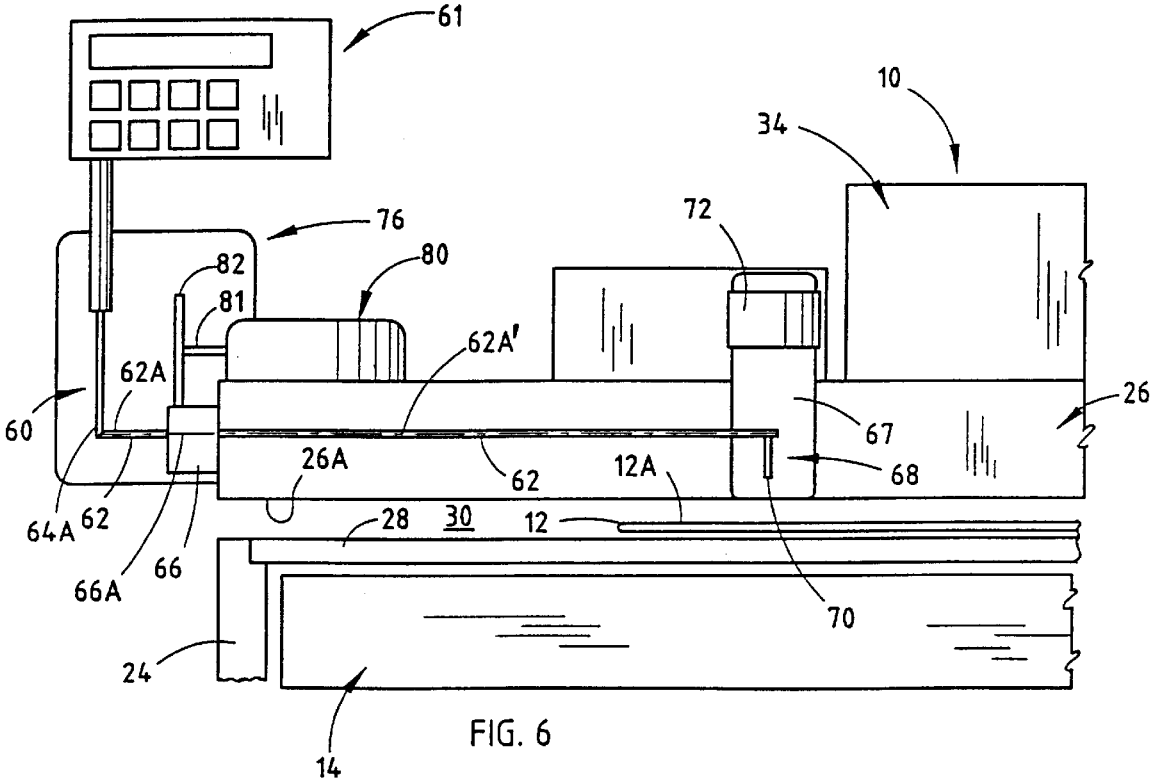
FIG. 6 is a schematic representation of an emissivity measurement system cooperating with the chemical vapor deposition chamber of FIG. 1.
Figure 2:
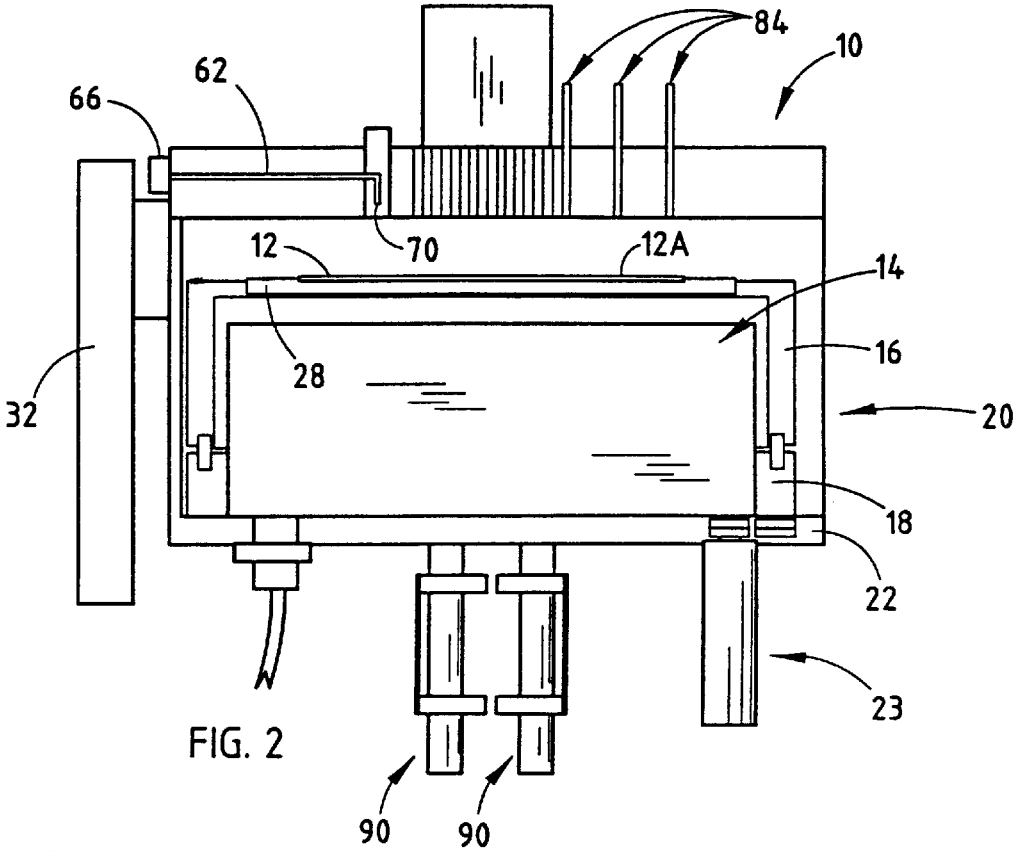
FIG. 2 is a schematic sectional view taken along line II—II of FIG. 1.

Referring now to the drawings and particular to FIGS. 1 and 2, a reactor for processing semiconductor substrates is generally indicated by the numeral 10. In the illustrated embodiment, reactor 10 comprises a single wafer processing reactor that is suitable for performing various fabrication processes on a semiconductor substrate 12, such as a semiconductor wafer. Reactor 10 is particularly suitable for thermal processing of a semiconductor wafer. Such thermal processes include thermal annealing of a semiconductor wafer and thermal reflow of boro-phosphorous gasses, and chemical vapor deposition of thin film applications, such as high temperature oxide, low temperature oxide, high temperature nitride, doped and undoped polysilicon, silicon epitaxial and tungsten metal and tungsten silicide films, in the fabrication of a semiconductor device. The control of these processes depends on the control of gas flow, gas pressure, and wafer temperature. As will be described in more detail, reactor 10 includes a heater assembly 14, which delivers heat to the substrate 12 in a uniform manner, a gas injection assembly 34, which selectively delivers and directs gas to a discrete region of the substrate in a uniform and controlled manner, and an emissivity measurement assembly 60, which permits continuous emissivity measurement of the average surface area of the device side of the substrate during processing so that the amount and/or the profile of the heat being delivered to the substrate during processing may be adjusted.

As best seen in FIG. 2, reactor 10 includes a heater assembly 14, which is enclosed in a heater housing 16. Heater assembly 14 is designed to deliver radiant heat to substrate 12 in a manner such that the temperature in the substrate is substantially uniform. In a preferred form, heater assembly 14 includes an array of heating elements such as linear tungsten-halogen lamps (not shown), which emit peak radiation at 0.95 microns and are layered to form a plurality of heating zones, which provide a concentrated heating profile with a greater amount of heat being applied to the outer perimeter of the substrate than the center of the substrate. For further details of heater assembly 14, reference is made to pending U.S. patent application entitled RAPID THERMAL PROCESSING HEATER TECHNOLOGY AND METHOD OF USE, filed on Dec. 4, 1996. Ser. No. 08/759,559, which is incorporated herein by reference in its entirety. It should be understood that other heaters may be used in reactor 10, preferably heaters which deliver heat to substrate in a substantially uniform manner.

Heater assembly 14 is enclosed in heater housing 16, which is mounted on a rotatable base 18. Heater housing 16 is made from a suitable material, such as a ceramic, graphite or, more preferably, silicon graphite coated graphite, or the like. Heater assembly 14, heater housing 16, and rotatable base 18 are enclosed and vacuum sealed in an outer, reactor housing 20 and are supported on a base wall 22 of reactor housing 20. Reactor housing 20 may be formed from a variety of metal materials. For example, aluminum is suitable in some applications, whereas stainless steel is more suitable in others. The choice of material is driven by the type of chemicals used during the deposition process and their reactivity with respect to the metal of choice, as is understood by those persons skilled in the art. The chamber walls are typically water cooled to approximately 45–75 degrees Fahrenheit by a conventional recirculating chilled water flow system, which is commonly known in the art.

Figure 3:
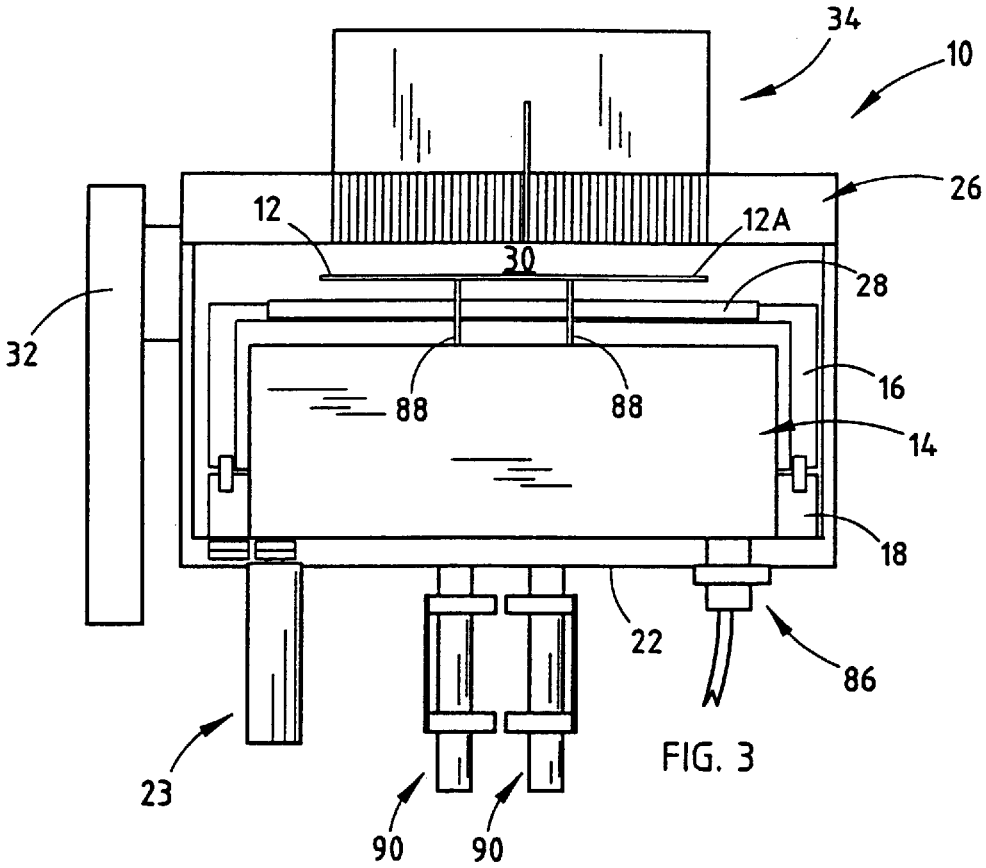
FIG. 3 is an enlarged view taken along section lines III—III of FIG. 2 illustrating the gas injection system.

Referring to FIGS. 2 and 3, base 18 and housing 16 are rotatably supported on base wall 22 of housing and are preferably rotated using a conventional magnetically coupled drive mechanism 23, or other suitable driving device which can impart rotation to base 18 through a vacuum seal. The revolutions per minute (rpm) of base 18 and housing 16 may be preset, for example preferably in a range of 5 to 60 rpm depending on the specific process, again as is understood by those persons skilled in the art.

As best seen in FIG. 1, reactor housing 20 includes a cylindrical outer wall 24 and a cover 26 which extends over cylindrical outer wall 24. Substrate 12 is supported in reactor housing 20 on a platform 28, which is made from a suitable material, such as silicon carbide coated graphite, quartz, pure silicon carbide, alumina, zirconia, aluminum, steel, or the like, and is oriented with its device side 12a directed toward cover 26. For details of a preferred embodiment of platform 28, reference is made to pending U.S. patent application entitled A SUBSTRATE PLATFORM FOR A SEMICONDUCTOR SUBSTRATE DURING RAPID HIGH TEMPERATURE PROCESSING AND METHOD OF SUPPORTING A SUBSTRATE filed on Aug. 15, 1997, Ser. No. 08/912,242, by Imad Mahawili, which is herein incorporated by reference in its entirety. Platform 28 is seated and supported in a recess or central opening 16a provided in a top wall 27 of housing 16 and spaced from cover 26 and substantially extends over and completely cover opening 16a. Consequently, heater assembly 14 is completely enclosed by heater housing 16 and platform 28, which when placed on top of the housing 16, completes the enclosure of heater assembly 14. Platform 28 can accommodate various substrate sizes and, in particular, can accommodate substrates with 150, 200 and 300 mm diameters. The space between platform 28 and the lower surface 26a of cover 26 defines an evacuated process chamber 30, which is evacuated through the vacuum exhaust parts placed in a gas injector assembly 34. Preferably, substrate 12 is introduced into evacuated chamber 30 through a chamber valve 32 and is placed on platform 28 by a conventional wafer transport device (not shown), such as an automated transport robot.

Figure 4:
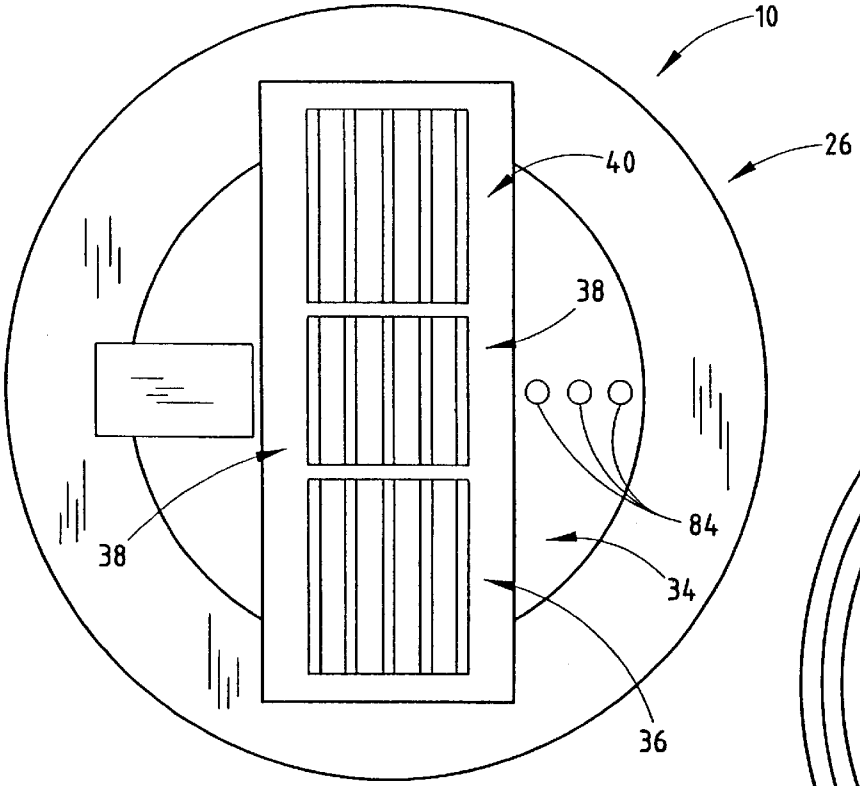
FIG. 4 is a top plan view of the chamber cover.
Figure 5:
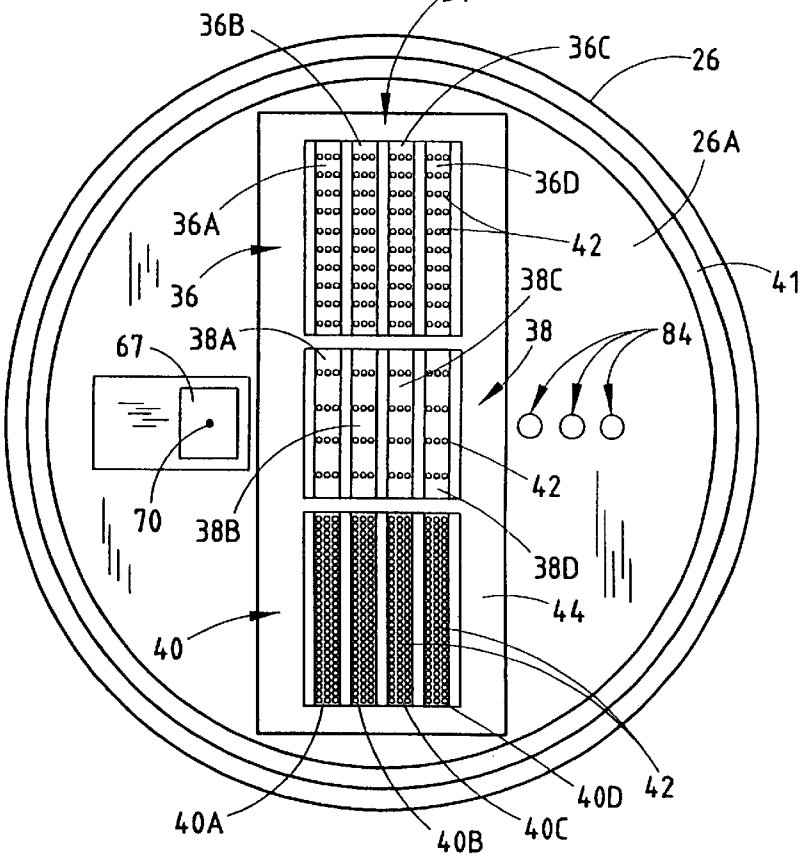
FIG. 5 is a bottom plan view of the chamber cover.

Referring to FIGS. 4 and 5, reactor 10 further includes gas injection manifold 34 which injects one or more gases onto a localized or discrete region of the substrate surface wherein thin film deposition takes place. Gas injection manifold 34 is positioned in cover 26 and includes a plurality of reactive gas injection segments 36, 38, and 40, an inert gas injection ring 41, and an exhaust manifold 44. Injection ring 41 injects an inert gas, preferably nitrogen or the like, into processing chamber 30 and directs the inert gas to the perimeter of the substrate to form a gas barrier so that the reactive gases injected through gas injection segments 36, 38, and 40 are confined to the area of the substrate directly below the respective segments 36, 38, and 40 due to the placement of vacuum exhaust manifold 44 adjacent gas injection segments 36, 38, and 40. As best seen in FIG. 5, gas injection segments 36, 38, and 40 are aligned in a central region of cover 26 to inject one or more gases, reactive and inert gases, into chamber 30. Exhaust manifold 44 extends along and adjacent gas injection segments 36, 38, and 40 so that gases directed onto substrate 12 are confined to a discrete area across the substrate, which preferably extends from one side or edge of the substrate to an opposed side or edge of substrate 12. It should be understood that gases injected by gas injection segments 36, 38, and 40 are directed in the general direction substrate 12 and any stray gas molecules which migrate near the region under exhaust manifold 44 will be exhausted from processing chamber 30. Therefore, the gases introduced by gas injection segments 36, 38, and 40 are confined to a discrete volume of processing chamber 30 and to a discrete area of substrate 12.

Each gas injection segment 36, 38, 40 includes a plurality of channels 36a, 36b, 36c, 36d, 38a, 38b, 38c, 38d, 40a, 40b, 40c, and 40d, respectively, which are arranged in a parallel adjacent relationship. Each channel 36a, 36b, 36c, 36d, 38a, 38b, 38c, 38d 40a, 40b, 40c, and 40d includes a plurality of injectors or orifices 42. Orifices 42 may be arranged in a uniform manner to provide the same flow rate of gas across width of substrate 12. Alternatively, one or more channels may include orifices 42 that are arranged in a non-uniform pattern to vary the profile of the gas flow across the substrate. Preferably, the profile of the flow of the gas is adjusted to direct less gas to the center of the substrate than to the regions toward the perimeter of the substrate. For example, channels 38a–38d, which are generally aligned with the central portion of the substrate, may include one density or concentration of spaced orifices, and channels 36a–36d and 40a–40d, which are generally aligned along the peripheral portions of the substrate, may include a higher density or concentration of orifices 42 than channels 38a–38d. In this manner, the flow of gas from the various groups of orifices 42 has a flow profile that varies across the substrate so that the regions over the central region and the peripheral region of the substrate are treated with the same density of gas to achieve a more uniform film deposition on the substrate. It should be understood that the number of orifices and the spacing between orifices 42 may be individually adjusted to prove a more uniform flow or to direct more gas to one area of the substrate than another where different devices are being fabricated.

Furthermore, each orifice 42/ channel 36a, 36b, 36c, 36d, 38a, 38b, 38c, 38d 40a, 40b, 40c, and 40d and/or segments 36, 38, and 40 may be coupled to a valve or regulator (not shown) which may be adjusted using conventional controls to vary the flow of gas from each orifice, channel, or gas injection segment or zone 36, 38, and 40 to adapt the gas flow profile. Furthermore, the controls may adjust the sequence of gas flowing from the orifices, channels, or segments. Moreover, each regulator may be adapted for connection with one or more sources of reactant gases. Depending on the application, the flow through each orifice/ channel/ segment/ may be individually controlled so that they can all turn on together, sequence one segment after another, or sequence the segments randomly with various time intervals between each on/off cycle. Furthermore, as reactive gases are turned off from one segment, an inert gas may be injected into that segment to control the reaction conditions at the surface of the wafer and to prevent any back flow contamination of reactants. The design of a particular duty cycle for each of the segments would, therefore, depend on the thin film process that is being optimized and it would vary from one film to another. Furthermore, each of the respective orifices, channels, or gas injection segments 36, 38, 40 may be associated with an injection of a specific gas. For example, gas injection zones 36 and 40 may be used to inject gas A while gas injection zone 38 may be used to inject gas B. In this manner, two reactive gases (A and B) may be injected that mix and react on the device side of the substrate. It should be understood by those skilled in the art that a wide variety of gasses can be employed and selectively introduced through the orifices 42, for example, hydrogen, argon, tungsten hexaflouride, or the like, to process substrate 12.

As best seen in FIG. 5, gas injection manifold 34 includes exhaust manifold 44. As described above, exhaust manifold 44 extends around segments 36, 38, and 40 to provide an additional boundary beyond which the reactive gases can not extend. In addition to removing unreacted gases from processing chamber 30, exhaust manifold also assists in the prevention of back flow contamination of the reactant gases. In combination with injection ring 41, exhaust manifold 44 controls the film deposition on substrate 12 in a manner which results in localized area of film deposition and, therefore, permits the use of an emissivity measurement system, described below.

Reactor 10 further includes a non-contact emissivity measurement system 60 for measuring the emissivity and calculating the temperature of substrate 12 during the various fabrication processes. Emissivity measurement system 60 includes a central processing unit 61 and a pair of fiber optic communication cables 62 and 64 which are coupled together and coupled to central processing unit 61. Fiber optic cable 62 preferably comprises a sapphire fiber optic communication cable and extends into cover 26 of reactor housing 20 through a rigid member 66, which provides a vacuum feedthrough to reactor 10. Cable 62 extends through member 66 into a cavity 67 provided in cover 26, which is positioned above platform 28 and substrate 12. Member 66 is preferably a cylindrical drive shaft and, more preferably, a stainless steel cylindrical drive shaft, and is rotatably mounted in cover 26. One end 68 of fiber optic cable 62 is bent or oriented for directing at substrate 12 and light source 72, as will be more fully explained below, with the photon sensing end of cable 62 forming a fiber optic photon density sensor or probe 70. The second end portion of cable 62 extends through shaft 66 and into a fiber optic housing 76, which is mounted to an exterior surface of cylindrical wall 24 of housing 20. Distal end 62a of cable 62 is slip attached to a distal end 64a of cable 64, which preferably comprises a quartz fiber optic communication cable, in fiber optic housing 76. The other end of fiber optic communication cable 64 is then connected to processor 61. In this manner, when cable 62 is rotated, cable 62 remains in communication with cable 64 and processing unit 61 through the slip connection between the two communication cables. Processor 61 preferably comprises a measuring instrument, for example a Luxtron Model 100, which converts the photon density measured by fiber optic sensor 70 into an electrical current, which is displayed by processor 61.

The position of fiber optic sensor 70 is changed by a driver 80, preferably a motor, which is housed in fiber optic housing 76 and which is drivingly coupled to shaft 66. Motor 80 includes a drive shaft 81 and a drive wheel 82, which engages and rotates shaft 66 about its longitudinal axis 66a. Motor 80 rotates shaft 66, which imparts rotation to fiber optic cable 62, so that the orientation of fiber optic sensor 70 is moved between a first position wherein the fiber optic sensor 70 is directed generally upward toward light source 72 and a second position in which it is directed generally downward to substrate 12. Therefore, end 68 of communication cable 62 is preferably oriented at a right angle with respect to the horizontal axis 62a of communication cable 62. In this manner sensor 70 can detect the photon density emitted from light source 72 and of the reflected light off substrate. Light source 72 preferably comprises a white light source, which emits light at a wavelength so that the wafer optical transmission is minimized, preferably, for example at a 0.95 micron wavelength. Emissivity measurement system 60 determines the temperature of substrate 12 by comparing of the radiation emitted by source 72 with that of the radiation emitted by substrate 12. Source 72 preferably includes at least one lamp which is a similar construction to the lamps used in heater assembly 14, which are described in pending U.S. patent application entitled RAPID THERMAL PROCESSING HEATER TECHNOLOGY AND METHOD OF USE.

Preferably, photon density sensor 70 is spaced and, preferably, located radially outward from gas injection system 34 and exhaust manifold 44 so that the gas, which is injected into chamber 30 and onto substrate 12, does not interfere with the temperature reading of emissivity sensor 70. Since heater assembly 14 is completely enclosed by the heater housing 16, there is no leakage of light from heater assembly 14 into deposition chamber 30, which could impact the readings taken by emissivity sensor 70. This eliminates probe characteristics matching or corrections associated with the conventional temperature measuring devices with two probes. After substrate 12 is placed on platform 28, housing 16 and platform 28 are rotated during processing by drive mechanism 23. When the emissivity of substrate 12 is to be measured, sensor 70 is rotated to view light source 72 directly above substrate 12 and light source 72 is turned on. Sensor 70 measures the incident photon density from light source 72. While light source 72 is still on, sensor 70 is rotated from its first position to its second position to view substrate 12 directly below light source 72 while it is rotating. In this position, sensor 70 measures the reflected photon density off the device side 12a of substrate 12. Light source 72 is then turned off. While still viewing substrate 12 directly, sensor 70 measures the emission of photons from heated substrate 12. This last value is subtracted from the reflected radiation value. According to Plank's law, the energy emitted off a given surface is related to the temperature of the surface to the fourth power. The proportionality constant consists of the product of the Stephen-Boltzmann constant and the surface emissivity. Therefore, the surface emissivity is preferably used when determining the temperature of the surface in non-contact methods. The following equations are used to calculate the total hemispherical reflectivity of device side 12a of substrate 12 and, subsequently, the emissivity, as given by Kirchoffs law:

$$\text{Wafer Reflectivity}=\text{Reflected Light Intensity}/\text{Incident Light Intensity} \quad (1)$$

$$\text{Emissivity}=(1-\text{Wafer Reflectivity}) \quad (2)$$

Once the substrate emissivity is calculated, the substrate temperature is then obtained from Plank's equations. This technique is also used when the substrate is hot and, under such application, the base thermal emission from the substrate is subtracted prior to executing the above calculation. Preferably, sensor 70 is left in the second position or wafer viewing position and, thus, constantly yields emissivity data every time source lamp 72 is turned on.

Since substrate 12 is rotating, sensor 70 collects photon density off the device side 12a of the substrate 12 during such rotation and, therefore, measures the reflection from the averaged surface topology of varied device structures that might be lithographed onto the substrate. Furthermore, since the emissivity measurement is performed during the process cycle including thin film deposition process, the instantaneous changes of emissivity are monitored and temperature corrections are performed dynamically and continuously. Once the emissivity is calculated, it is sent into the temperature control segment of the processor 21 where the emissivity value is used in the application of the Plank equation.

Reactor 10 further includes a plurality of optical fiber temperature measurement probes 84, which are fixed to cover 26 and constantly collect photon density emitted from device side 12a of substrate device 12 during all processing conditions. The temperatures measured by probes 84 are sent to the main control computer to compare them to a set temperature and any deviation is computed and transformed into a control current to drive a standard off-the-shelf SCR current relay to deliver the proportional power to each of the lamp zones within heater assembly 14. Preferably, reactor 10 includes three probes (84) which are positioned to measure the temperature of different parts of the wafer, which assures temperature uniformity during the processing cycle.

Temperature readings of substrate 12 calculated by central processing unit 21 are preferably used as input into a control system (not shown) which monitors and controls the output of heater assembly 14. The control system is coupled to heater assembly 14 through an electrical feedthrough 86 which extends to the base wall 22 of reactor housing 21. In order to maintain the vacuum in reactor 10, feedthrough 86 is sealed by an O-ring or sealed using other conventional sealing devices or methods.

After semiconductor substrate 12 has been processed, substrate 12 is raised off platform 28 by a plurality of lifter pins 88 which protrude through and lift substrate 12 off platform 28 for automatic loading and unloading of substrate 12 within reactor 10. Lifter pins 88 are raised and lowered by magnetically coupled wafer letters 90, which are conventionally known in the art. Pins 88 are centrally located in housing 16 and project through a central portion of the heater assembly 14 and through a central portion of platform 28. Similarly, to maintain the vacuum in chamber 30. Lifter pins 88 extend through O-ring seals provided in the base wall 22 of housing 20.

In preferred form, at least three lifter pins 88 are provided. In the most preferred form, four lifter pins 88 are provided, and platform 28 includes a corresponding number of openings to enable lifter pins 88 to protrude through and lift substrate 12 off platform 28 for automatic loading and unloading of substrate 12. It can be appreciated that lifter pins 88 can only be operated when housing is positioned so that the openings in platform 28 are aligned with lifter pins 88, for example in a "HOME" position.

For the purposes of the following description, the terms "up" or "down" and derivatives or equivalents thereof shall relate to the invention as oriented in FIGS. 1 to 6. It is understood that the invention may assume various alternative orientations, except where expressly specified to the contrary. It is also understood that the specific devices and methods illustrated in the attached drawings, and described in the following specification, are simply exemplary embodiments of the inventive concepts defined in the appended claims. Hence, specific dimensions and other physical characteristics relating to the embodiments disclosed herein are not to be considered Limiting unless the claims expressly state otherwise.

Accordingly, the present invention provides a reactor chamber which heats a substrate in a uniform manner and accurately measures the emissivity and calculates the temperature of the substrate during processing using a non-contact photon density measuring device and adjusts the profile of the applied heat as needed to achieve optimal processing of the substrate. Furthermore, the reactor chamber delivers and controls the flow of gas to the substrate during processing so that the substrate receives a uniform deposition of thin film of the process gas or gases in a discrete area on the substrate, which enables the use of a non-contact emissivity measurement system.

While several forms of the invention have been shown and described, other forms will now be apparent to those skilled in the art. Therefore, it will be understood that the embodiments shown in the drawings and described above are merely for illustrative purposes, and are not intended to limit the scope of the invention which is defined by the claims which follow.

We claim:

1. A reactor for processing a substrate, said reactor comprising:

a housing defining a processing chamber;

a light source supported in said housing;

a heater positioned in said housing, said heater being adapted to heat the substrate;

at least one gas injector adapted to inject at least one gas into said processing chamber onto a discrete area of the substrate; and a photon density sensor extending into said housing, said photon density sensor being adapted to measure the emissivity of the substrate and to move between a first position wherein said photon density sensor is directed to said light source and a second position wherein said photon density sensor is positioned for directing toward the substrate.

2. The reactor according to claim 1, further comprising first and second communication cables, said first communication cable including said photon density sensor and being in communication with said second cable and being adapted to send signals from said photon density sensor to a processor.

3. The reactor according to claim 2, wherein said first and second communications cable comprise optical communication cables.

4. The reactor according to claim 3, wherein said first communication cable comprises a sapphire optical communication cable.

5. The reactor according to claim 3, wherein said second communication cable comprises a quartz optical communication cable.

6. The reactor according to claim 3, wherein said first and second communications cables are interconnected by a slip connection.

7. The reactor according to claim 6, wherein said first communication cable is rotated between said first and second positions by a driver.

8. The reactor according to claim 7, wherein said driver comprises a motor.

9. The reactor according to claim 7, wherein at least a portion of said first communication cable is housed in a rigid member, said driver drivingly engaging said rigid member to rotate said communication cable between said first position and said second position.

10. The reactor according to claim 9, wherein said rigid member comprises a cylindrical shaft.

11. The reactor according to claim 2, wherein said first communications cable includes an angled portion, said photon density sensor being defined on a distal end of said angle portion.

12. The reactor according to claim 1, wherein said housing includes a cover, said photon density sensor being supported by said cover.

13. The reactor according to claim 12, wherein said photon density sensor comprises an optic communication fiber.

14. The reactor according to claim 13, wherein said optic communication fiber comprises a sapphire optic communication fiber.

15. The reactor according to claim 1, further comprising a second housing, said second housing being rotatably supported in said housing defining a processing chamber and being adapted to rotatably support the substrate in said processing chamber.

16. A reactor for processing a substrate, said reactor comprising:

a housing defining a processing chamber;

a light source supported in said housing;

a heater adapted to heat the substrate, said heater being supported in said housing;

a photon density sensor extending into said housing, said photon density sensor being adapted to measure the emissivity of the substrate and to move between a first position wherein said photon density sensor is directed to said light source and a second position wherein said photon density sensor is positioned for directing toward the substrate; and a plurality of gas injectors supported by said housing, said plurality of gas injectors being adapted to inject at least one reactant gas into said processing chamber.

17. The reactor according to claim 16, wherein said gas injectors are arranged into at least two groups of gas injectors, each of said groups of gas injectors being adapted to selectively deliver at least one reactant gas and an inert gas into said processing chamber.

18. The reactor according to claim 16, further including a manifold supported by said housing said manifold being adapted to inject inert gas into said processing chamber.

19. The reactor according to claim 18, wherein said manifold comprises an injection ring, said injection ring being positioned and adapted to align with the periphery of the substrate for at least directing inert gas onto the periphery of the substrate.

20. The reactor according to claim 16, wherein each of said injectors is adapted to be independently controlled whereby flow of gas through each of said injectors can be independently adjusted.

21. The reactor according to claim 16, wherein said gas injectors are arranged in a uniform pattern adapted to direct a uniform flow of a gas toward the substrate.

22. The reactor according to claim 16, wherein said gas injectors are adapted to deliver the gas on a discrete area of the substrate.

23. The reactor according to claim 22, further comprising an exhaust manifold, said exhaust manifold adapted to remove unreacted gas from the processing chamber and to substantially confine the gas over the discrete area of the substrate.

24. The reactor according to claim 23, wherein said manifold extends around said plurality of gas injectors to substantially confine the gas in the processing chamber over the discrete area of the substrate, said exhaust manifold interposed between said injectors and said photon density sensor whereby said photon density sensor is free from film depositions from the gas.

25. The reactor according to claim 16, wherein said gas injectors are arranged in with a greater concentration of said gas injectors positioned and adapted to align with a peripheral region of the substrate and with a smaller concentration of gas injectors positioned and adapted to align with a central region of the substrate whereby the gas injected by the gas injectors produces a uniform deposition on the substrate.

26. The reactor according to claim 16, wherein said housing comprises a first housing, said reactor further comprising a second housing rotatably supported in said first housing, said second housing enclosing said heater and rotatably supporting the substrate thereon.

27. The reactor according to claim 26, said second housing having a removable platform, said removable platform being adapted to support the substrate in said processing chamber.

28. A method of processing a semiconductor substrate comprising the steps of:

providing a processing chamber;

supporting the substrate in the processing chamber;

directing light into the processing chamber toward the substrate;

providing a photon density sensor;

directing the photon density sensor to the light;

measuring the incident photon density from the light with the photon density sensor;

repositioning the photon density sensor to direct the photon density sensor to the substrate;

measuring the reflection of the light off the substrate;

comparing the measured incident photon density to the reflected light to calculate the substrate temperature;

heating the substrate; and injecting at least one reactant gas into the chamber through at least one injector.

29. A method of processing a semiconductor substrate according to claim 28, wherein repositioning the photon density sensor includes rotating the photon density sensor.

30. A method of processing a semiconductor substrate according to claim 28, wherein rotating the photon density sensor includes rotating the photon density sensor about one hundred eighty degrees.

31. A method of processing a semiconductor substrate according to claim 28, wherein comparing the measured incident photon density to the reflected light includes:

providing a processor;

sending signals from the photon density sensor to the processor to calculate the substrate emissivity and temperature; and calculating the temperature with the processor from the signals from the photon density sensor.

32. A method of processing a semiconductor substrate according to claim [28]*31*, wherein sending signals includes:

forming the photon density sensor on a first communications cable: and coupling the first communications cable to the processor.

33. A method of processing a semiconductor substrate according to claim 32, wherein coupling includes coupling the first communications cable to a second communications cable and coupling the second communications cable to the processor.

34. A method of processing a semiconductor substrate according to claim 33, wherein coupling the first communications cable to the second communications cable includes providing a slip coupling between the first communications cable and the second communications cable.

35. A method of processing a semiconductor substrate according to claim 28, further comprising adjusting the heating based on the temperature of the substrate.

36. A method of processing a semiconductor substrate according to claim 28, further comprising rotating the substrate in the processing chamber, said injecting includes directing the reactant gas to a discrete portion of the substrate while the substrate is rotating.

37. A method of processing a semiconductor substrate according to claim 36, wherein directing the reactant gas includes exhausting unreacted gas from the processing chamber to isolate the reactant gas over the discrete portion of the substrate whereby the photon density sensor remains free of undesirable film depositions from the reactant gas.

38. A method of processing a semiconductor substrate according to claim 28, wherein injecting includes a first reactant gas through a first group of the gas injectors and injecting a second reactant gas through a second group of the gas injectors.

39. A method of processing a semiconductor substrate according to claim 28, further comprising selectively varying the flow of the reactant gas through the gas injectors.

40. A method of processing a semiconductor substrate according to claim 28, further comprising arranging the gas injectors in a uniform pattern to direct a uniform flow of gas into the processing chamber.

41. A method of processing a semiconductor substrate according to claim 28, wherein injecting includes injecting the gas into the processing chamber with a non-uniform profile for uniformly depositing film on the substrate.

42. A method of processing a semiconductor substrate according to claim 41, wherein injecting the gas into the chamber with a non-uniform profile includes arranging the gas injectors in a non-uniform pattern to direct more gas to a peripheral region of the substrate and less gas to the central region of the substrate.

*43. A reactor for processing a substrate, said reactor comprising:*

*a housing defining a processing chamber;*

*a light source positioned in said housing;*

*a heater positioned in said housing, said heater being adapted to heat the substrate;*

*at least one gas injector adapted to inject at least one gas into said processing chamber onto a surface of the substrate; and*

*a photon density sensor positioned in said housing, said photon density sensor being adapted to measure the emissivity of the substrate and to move between a first position wherein said photon density sensor is directed to said light source and a second position wherein said photon density sensor is positioned for directing toward the substrate.*

*44. The reactor according to claim 43, further comprising first and second communication cables, said first communication cable including said photon density sensor and being in communication with said second cable and being adapted to send signals from said photon density sensor to a processor.*

*45. The reactor according to claim 43, wherein said first and second communications cable comprise optical communication cables.*

*46. The reactor according to claim 45, wherein said first and second communications cables are interconnected by a slip connection.*

*47. The reactor according to claim 46, wherein said first communication cable is rotated between said first and second positions by a driver.*

*48. The reactor according to claim 44, wherein said first communications cable includes an angled portion said photon density sensor being defined on a distal end of said angle portion.*

*49. The reactor according to claim 43, further comprising a second housing, said second housing being rotatably supported in said housing defining a processing chamber and being adapted to rotatably support the substrate in said processing chamber.*

*50. A reactor for processing a substrate said reactor comprising:*

*a housing defining a processing chamber;*

*a light source positioned in said housing;*

*a heater adapted to heat the substrate said heater being supported in said housing;*

*a photon density sensor positioned in said housing, said photon density sensor being adapted to measure the emissivity of the substrate and to move between a first position wherein said photon density sensor is directed to said light source and a second position wherein said photon density sensor is positioned for directing toward the substrate; and*

*at least one gas injector supported by said housing, said gas injector being adapted to inject at least one reactant gas into said processing chamber.*

*51. The reactor according to claim 50, wherein said gas injector comprises a plurality of gas injectors said gas injectors are arranged into at least two groups of gas injectors, each of said groups of gas injectors being adapted to selectively deliver at least one reactant gas and an inert gas into said processing chamber.*

*52. The reactor according to claim 50, further including a manifold supported by said housing, said manifold including said at least one gas injector, said manifold being adapted to inject inert gas into said processing chamber.*

*53. The reactor according to claim 52, wherein said manifold comprises injection ring, said injection ring including a plurality of said gas injector said injection ring being positioned and adapted to align with the periphery of the substrate for at least directing inert gas onto the periphery of the substrate.*

*54. The reactor according to claim 50, wherein said at least one gas injector comprises a plurality of gas injectors, each of said injectors is adapted to be independently controlled whereby flow of gas through each of said injectors can be independently adjusted.*

*55. The reactor according to claim 50, wherein said at least one gas injector comprises a plurality of gas injectors, said gas injectors are arranged in a uniform pattern adapted to direct a uniform flow of a gas toward the substrate.*

*56. The reactor according to claim 50 wherein said gas injector is adapted to deliver the gas on a discrete area of the substrate.*

*57. The reactor according to claim 56, further comprising an exhaust manifold, said exhaust manifold adapted to remove unreacted gas from the processing chamber and to substantially confine the gas over the discrete area of the substrate.*

*58. The reactor according to claim 57, wherein said at least one gas injector comprising a plurality of gas injectors, said manifold extending around said plurality of gas injectors to substantially confine the gas in the processing chamber over the discrete area of the substrate, said exhaust manifold interposed between said injectors and said photon density sensor whereby said photon density sensor is free from film depositions from the gas.*

*59. The reactor according to claim 50, wherein said at least one gas injector comprises a plurality of gas injectors, said gas injectors are arranged in with a greater concentration of said gas injectors positioned and adapted to align with a peripheral region of the substrate and with a smaller concentration of gas injectors positioned and adapted to align with a central region of the substrate whereby the gas injected by the gas injectors produces a uniform deposition on the substrate.*

*60. The reactor according to claim 50, wherein said housing comprises a first housing, said reactor further comprising a second housing rotatably supported in said first housing, said second housing enclosing said heater and rotatably supporting the substrate thereon.*

*61. The reactor according to claim 60, said second housing having a removable platform, said removable platform being adapted to support the substrate in said processing chamber.*

* * * * *

UNITED STATES PATENT AND TRADEMARK OFFICE

CERTIFICATE OF CORRECTION

PATENT NO. : RE 37,546 E
APPLICATION NO. : 09/672842
DATED : February 12, 2002
INVENTOR(S) : Imad Mahawili It is certified that error appears in the above-identified patent and that said Letters Patent is hereby corrected as shown below:

Column 7:
Line 7, “prove” should be --provide--.

Column 10:
Line 4, “letters” should be --lifters--.

Column 15:
Line 6, Claim 53, Insert --an-- after “comprises”.

Signed and Sealed this

Sixteenth Day of June, 2009

John Doll

JOHN DOLL
*Acting Director of the United States Patent and Trademark Office*